United States Patent
Enkisch et al.

(10) Patent No.: US 9,915,873 B2
(45) Date of Patent: Mar. 13, 2018

(54) REFLECTIVE OPTICAL ELEMENT, AND OPTICAL SYSTEM OF A MICROLITHOGRAPHIC PROJECTION EXPOSURE APPARATUS

(71) Applicant: Carl Zeiss SMT GmbH, Oberkochen (DE)

(72) Inventors: Hartmut Enkisch, Aalen (DE); Hans-Jochen Paul, Aalen (DE); Thomas Schicketanz, Aalen (DE); Oliver Dier, Lauchheim (DE); Joern Weber, Aalen (DE); Christian Grasse, Garching (DE); Ralf Winter, Schwaebisch Gmuend (DE); Sebastian Strobel, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/160,616

(22) Filed: May 20, 2016

(65) Prior Publication Data
US 2016/0266499 A1      Sep. 15, 2016

Related U.S. Application Data

(63) Continuation of application No. PCT/EP2014/075356, filed on Nov. 24, 2014.

(30) Foreign Application Priority Data

Nov. 22, 2013   (DE) .................. 10 2013 223 895

(51) Int. Cl.
*G03F 7/20*   (2006.01)
*G21K 1/06*   (2006.01)
*G02B 5/08*   (2006.01)

(52) U.S. Cl.
CPC .......... *G03F 7/7015* (2013.01); *G02B 5/0891* (2013.01); *G03F 7/70316* (2013.01); *G21K 1/062* (2013.01)

(58) Field of Classification Search
CPC ..... G02B 5/0891; G02B 5/208; G03F 7/7015; G03F 7/70316; G21K 1/062
See application file for complete search history.

(56) References Cited

U.S. PATENT DOCUMENTS

| | | |
|---|---|---|
| 2005/0031071 A1 | 2/2005 | Kanazawa et al. |
| 2007/0171327 A1* | 7/2007 | Matsumodo ........... B82Y 10/00 349/65 |
| 2010/0239822 A1 | 9/2010 | Pelizzo et al. |

OTHER PUBLICATIONS

International Search Report in counterpart International Application No. PCT/EP2014/015356, dated Mar. 13, 2015.
(Continued)

*Primary Examiner* — Steven H Whitesell Gordon
(74) *Attorney, Agent, or Firm* — Edell, Shapiro & Finnan, LLC (57) ABSTRACT

A reflective optical element (50) having a substrate (52) and a multilayer system (51) that has a plurality of partial stacks (53), each with a first layer (54) of a first material and a second layer (55) of a second material. The first material and the second material differ from one another in refractive index at an operating wavelength of the optical element. Each of the partial stacks has a thickness ($D_i$) and a layer thickness ratio ($\Gamma_i$), wherein the layer thickness ratio is the quotient of the thickness of the respective first layer and the partial stack thickness ($D_i$). In a first section of the multilayer system, for at least one of the two variables of partial stack thickness ($D_i$) and layer thickness ratio ($\Gamma_i$), the mean square deviation from the respective mean values therefor is at least 10% less than in a second section of the multilayer system.

24 Claims, 11 Drawing Sheets

(56) References Cited

OTHER PUBLICATIONS

Wang, Z. et al., The design, fabrication and characterization of broadband multilayer mirrors . . . , SPIE, vol. 4146, Nov. 1, 2000, pp. 83-90, XP002491918.
International Preliminary Report on Patentability and Written Opinion in counterpart International Application No. PCT/EP2014/075356, dated May 24, 2016.
Office Action in corresponding German Application No. 102013223895.9, dated Jul. 11, 2014, along with an English translation.

* cited by examiner

REFLECTIVE OPTICAL ELEMENT, AND OPTICAL SYSTEM OF A MICROLITHOGRAPHIC PROJECTION EXPOSURE APPARATUS

CROSS REFERENCE TO RELATED APPLICATIONS

This is a Continuation of International Application PCT/EP2014/075356, which has an international filing date of Nov. 24, 2014, and the disclosure of which is incorporated in its entirety into the present Continuation by reference. The following disclosure is also based on and claims the benefit of and priority under 35 U.S.C. § 119(a) to German Patent Application No. DE 10 2013 223 895.9, filed Nov. 22, 2013, which is also incorporated in its entirety into the present Continuation by reference.

FIELD OF THE INVENTION

The present invention relates to a reflective optical element and to an optical system of a microlithographic projection exposure apparatus.

BACKGROUND

Microlithography is used for producing microstructured components, such as for example integrated circuits or Liquid Crystal Displays (LCDs). The microlithography process is carried out in a so-called projection exposure apparatus having an illumination device and a projection lens. The image of a mask (reticle) illuminated by the illumination device is projected by the projection lens onto a substrate (for example a silicon wafer) coated with a light-sensitive layer (photoresist) and arranged in the image plane of the projection lens, in order to transfer the mask structure to the light-sensitive coating of the substrate.

In projection lenses designed for the extreme ultraviolet (EUV) range, i.e. at wavelengths of e.g. approximately 13 nm or approximately 7 nm, owing to the lack of availability of suitable light-transmissive refractive materials, mirrors are used as optical components for the imaging process. Such EUV mirrors comprise a substrate and a multilayer system arranged on the substrate for reflecting the electromagnetic radiation impinging on the optically effective surface. A highest possible reflectivity of the individual reflective optical elements is desirable in order to ensure a sufficiently high total reflectivity.

In order to ensure a highest possible radiation throughput in a microlithographic projection exposure apparatus, it is endeavored, in the case of high local angle-of-incidence bandwidths, to reflect all rays of the local beam as uniformly well as possible at the individual reflective optical elements. For this purpose, the number and thicknesses of the individual partial stacks (i.e. the "period lengths" of the individual periods) of the multilayer system are optimized. In the simplest case, periodic multilayer systems can be involved, that is to say multilayer systems having substantially identical partial stacks, in which the number of periods is reduced to an extent such that the reflectivity curve has the desired width, wherein however the reflectivity still varies greatly with the angle of incidence and the wavelength.

In a further step, the multilayer system can also have two sections, in which the respective total stack thickness and the layer thickness ratio within the stacks are different. Furthermore, these two sections can also have different numbers of stacks. In variants, three or more sections having different total stack thicknesses and layer thickness ratios can also be provided. A further approach consists in totally canceling the boundary conditions for the thicknesses of the individual layers. This leads to a totally stochastic, also referred to as an aperiodic, multilayer system. In this way, it is possible to design the most flexibly multilayer systems whose reflectivity varies as little as possible with the angle of incidence and the wavelength. One feature of such stochastic multilayer systems is that numerous layer thickness sequences can result in very similar reflectivity curves both depending on the wavelength and depending on the angle of incidence.

For the performance and the optical properties of a reflective optical element which is used together with further reflective optical elements in a microlithographic projection exposure apparatus, the lateral profile of the individual layer thicknesses, which is also called profile, is also of importance in addition to the vertical construction of the multilayer system. For controlling the lateral profile during the production of a reflective optical element, it is possible to use X-ray diffraction, for example, wherein the reflectivity is measured depending on the angle of incidence. In this case, the copper $K_\alpha$ X-ray wave line is appropriate for reflective optical elements for the EUV wavelength range. A particularly accurate characterization of the lateral profile of the layer thicknesses is possible if the diffractogram has a sufficient number of sufficiently sharp peaks.

With regard to the prior art, reference is made by way of example to US 2010/0239822 A1.

SUMMARY

It is an object of the present invention to provide a reflective optical element which enables a further improvement in the reflection properties in particular also with comparatively wide angle-of-incidence spectra.

This object is achieved in accordance with the features of the independent patent claims.

A reflective optical element according to the invention comprises a substrate and a multilayer system arranged on the substrate,
wherein the multilayer system has a plurality of partial stacks each comprising a first layer of a first material and at least one second layer of a second material, wherein the first material and the second material differ from one another in the value of the real part of the refractive index at an operating wavelength of the reflective optical element (50), wherein each of the partial stacks has a partial stack thickness and a layer thickness ratio, wherein the layer thickness ratio is defined as the quotient of the thickness of the respective first layer (54) and the partial stack thickness; wherein in a first section of the multilayer system, for at least one of the two variables of partial stack thickness and layer thickness ratio, the mean square deviation from the respective mean value is at least 10% less than in a second section of the multilayer system; and
wherein the reflective optical element has a reflectivity R, the wavelength dependence of which in a wavelength interval of $\Delta\lambda=0.5$ nm has a PV value of less than 0.25, wherein the PV value is defined as $PV=(R_{max\_rel}-R_{min\_rel})/R_{max\_abs}$, wherein $R_{max\_rel}$ denotes the maximum reflectivity value in the wavelength interval $\Delta\lambda$, $R_{min\_rel}$ denotes the minimum reflectivity value in the wavelength interval $\Delta\lambda$, and $R_{max\_abs}$ denotes the absolute maximum reflectivity value.

The invention makes use of a recognition, in particular, with suitable configuration of the multilayer system, of firstly achieving a high bandwidth of the reflectivity over the wavelength and/or over the angle of incidence and at the same time still obtaining a sufficient number of pronounced peaks for instance during X-ray diffractometry or Cu—$K_\alpha$ diffractometry, with the consequence that an effective control and optimization of the lateral layer thickness profile can be implemented.

The invention makes further use of the insight, in the construction of the multilayer system, of combining a first section or a first group of partial stacks having comparatively greater deviation (from a periodicity with regard to partial stack thickness and layer thickness ratio) with a second section or a second group of partial stacks having comparatively lesser deviation from the periodicity, with the consequence that, in conjunction with a still sufficient broadband nature of the reflective optical element (obtained with the second section) in the associated Cu—$K_\alpha$-diffractogram, as will be explained in even greater detail, discrete peaks (obtained with the first section) are still evident.

In accordance with one embodiment, in the first section of the multilayer system, for at least one of the two variables of partial stack thickness and layer thickness ratio, the mean square deviation from the respective mean value is at least 20%, in particular at least 30%, more particularly at least 50%, less than in the second section of the multilayer system.

In accordance with one embodiment, the wavelength dependence of the reflectivity R in a wavelength interval of $\Delta\lambda=0.5$ nm has a PV value of less than 0.20, in particular less than 0.18, more particularly less than 0.15.

In accordance with one embodiment, the second section is arranged closer to the substrate than the first section.

In embodiments of the invention, the upper part (i.e. the part further away from the substrate) of the layer construction thus still contains "that periodicity" which is required to obtain still sufficiently precisely evaluatable Cu—$K_\alpha$-diffractograms, while the lower part (i.e. the part closer to the substrate) of the layer construction provides for the aperiodicity required to still achieve a sufficient broadband nature of the reflectivity curve. In other words, on account of the upper part of the layer construction, unambiguously identifiable structures or peaks are still present in the Cu—$K_\alpha$-diffractogram.

However, the invention is not restricted to the positioning of the comparatively periodic portion of the layer construction on the side remote from the substrate. Rather, it is also possible, in principle, to provide the comparatively periodic portion of the layer construction closer to the substrate and instead to provide the comparatively aperiodic portion of the layer construction, required for the sufficient broadband nature of the reflectivity curve, remote from the substrate. Even if the structures or peaks obtained in the Cu—$K_\alpha$-diffractogram are more weakly pronounced in this case, they are nevertheless still unambiguously identifiable and thus still lead to an improvement in the evaluatability of the layer thickness profiles in the Cu—$K_\alpha$-diffractogram in comparison with a perfectly aperiodic layer construction, on the one hand, and to an improved broadband nature of the reflectivity curve in the diffractogram in comparison with a perfectly periodic layer construction, on the other hand.

In accordance with one embodiment, the first section and the second section jointly form the entire multilayer system. However, the invention is not restricted thereto, such that configurations in which at least one further section of the multilayer system, which can have greater or lesser deviations from the periodicity in comparison with the first and/or second section, are also intended to be encompassed by the invention.

In accordance with one embodiment, the wavelength dependence of the reflectivity R of the reflective optical element in a wavelength range of $\Delta\lambda=0.5$ nm has at least two local extrema which differ from one another in terms of the reflectivity by at least 0.1%, relative to the larger value.

This configuration is based on the further insight that the reflection curve determined for a multilayer system according to the invention as a dependence of the reflectivity on the wavelength or the angle of incidence can then be used advantageously for an optimization of the individual parameters of the layer sequence if this reflection curve does not have a "perfect plateau", but rather a plurality of local extrema (maxima or minima) in the manner of a superimposed, weak oscillation.

In accordance with one embodiment, the local extrema differ from one another in terms of the reflectivity by at most 5%, relative to the larger value.

This further exploits the circumstance that the optical system (e.g. the microlithographic projection exposure apparatus) is typically operated with a certain spectral distribution and thus different wavelengths and a certain averaging of the intensities obtained for different wavelengths thus also takes place. In other words, the local extrema (maxima and minima) in the reflection curve that are suitable for characterizing or optimizing the multilayer system are compensated for again on account of the averaging effect during operation of the optical system, such that no undesired impairment of the imaging result takes place as a result.

The above-described configuration regarding the local extrema contained in the reflectivity curve is also advantageous independently of the above-discussed configuration of the multilayer system comprising at least two sections that deviate from the periodicity to different extents.

In accordance with a further aspect, the invention therefore also relates to a reflective optical element comprising a substrate and a multilayer system arranged on the substrate, wherein the multilayer system has a plurality of partial stacks each comprising a first layer of a first material and at least one second layer of a second material, wherein the first material and the second material differ from one another in the value of the real part of the refractive index at an operating wavelength of the reflective optical element; the reflective optical element has a reflectivity R, the wavelength dependence of which in a wavelength interval of $\Delta\lambda=0.5$ nm has a PV value of less than 0.25, wherein the PV value is defined as $PV=(R_{max\_rel}-R_{min\_rel})/R_{max\_abs}$, wherein $R_{max\_rel}$ denotes the maximum reflectivity value in the wavelength interval $\Delta\lambda$, $R_{min\_rel}$ denotes the minimum reflectivity value in the wavelength interval $\Delta\lambda$, and $R_{max\_abs}$ denotes the absolute maximum reflectivity value; and wherein the wavelength dependence of the reflectivity R of the reflective optical element in a wavelength range of $\Delta\lambda=0.5$ nm has at least two local extrema which differ from one another in terms of the reflectivity by at least 0.1% and by at most 5%, in each case relative to the larger value.

In accordance with one embodiment, the two local extrema differ from one another in terms of the reflectivity by at least 0.5%, relative to the larger value.

In accordance with one embodiment, the local extrema differ from one another in terms of the reflectivity by at most 2.5%, more particularly by at most 1%, in each case relative to the larger value.

In accordance with one embodiment, the first material is selected from the group containing molybdenum, ruthenium and rhodium. The second material can be silicon, in particular. Reflective optical elements comprising a multilayer system which is based on one of these material combinations are suitable in particular for use at wavelengths of between 12.5 nm and 15 nm.

In accordance with one embodiment, the reflective optical element is designed for an operating wavelength of less than 30 nm, in particular less than 15 nm.

The invention furthermore relates to an optical system of a microlithographic projection exposure apparatus, which optical system comprises a reflective optical element having the features described above, and to a microlithographic projection exposure apparatus.

In accordance with a further approach, the disclosure also relates to a reflective optical element for the extreme ultraviolet wavelength range comprising a multilayer system on a substrate, wherein the multilayer system has layers comprising at least two different materials which differ in a different real part of the refractive index at a wavelength in the EUV wavelength range, wherein layers having higher and lower real parts of the refractive index are arranged alternately and a layer of a specific material together with the layers arranged between it and the layer or layers of the same material situated closest with increasing distance from the substrate forms a stack, wherein the multilayer system has N stacks and each stack $S_i$ where i=1 to N has a total thickness $D_i$ and a layer thickness ratio $\Gamma_i$ of the layers of the stack i, in which reflective optical element the values of the total thickness $D_i$ and of the layer thickness ratio $\Gamma_i$ are distributed stochastically and the multilayer system has at least two sections, wherein the probability that either the thicknesses $D_i$, $D_{i+1}$ or the layer thickness ratios $\Gamma_i$, $\Gamma_{i+1}$ of two successive stacks $S_i$, $S_{i+1}$ deviate from one another by less than 10% is greater in one section than in the other section or the other sections.

In this case, the disclosure is based on the insight that reflective optical elements comprising arbitrary stochastic multilayer systems are not readily suitable for Cu—$K_\alpha$-diffractometry since they may have in some instances only few and unsharp peaks. What are proposed are reflective optical elements with a class of stochastic multilayer systems which have sufficiently many and sharp peaks to allow a lateral layer thickness optimization with the aid of X-ray diffractometry. The provision of at least one section in the multilayer system whose stacks do not deviate from the periodicity to an excessively great extent means that a certain number of sufficiently sharp peaks are made available in these reflective optical elements for diffractometry for example with copper K$\alpha$-lines, such that the lateral layer thickness profile can be controlled well during the production of the reflective optical elements. The periodicity fostering the formation of peaks can then be approximated by virtue of the fact that in at least one section either the total thicknesses of the individual stacks do not deviate very greatly from one another or the thickness ratios deviate only little from one another.

Preferably, the thicknesses $D_i$, $D_{i+1}$ or the layer thickness ratios $\Gamma_i$, $\Gamma_{i+1}$ of two successive stacks $S_i$, $S_{i+1}$ in the one section are chosen such that the probability can be considered that they deviate from one another by less than 1%. In this case, sections in which the deviation for all stacks is less than 1% can be regarded as periodic. In preferred embodiments, the section having a greater probability that either with regard to the stack thickness or with regard to the thickness ratio within the stacks of the section the deviation from the periodicity is to a lesser extent than in the further section(s) of the multilayer system is arranged further away from the substrate than the section(s) having a lower probability. It can thus be ensured that the peaks present are particularly sharp. Preferably, provision is made of exactly two sections having different probabilities in the multilayer system, which reduces the complexity for the design of the multilayer system and the production of the reflective optical elements. In preferred embodiments, in the section having higher probability of deviating from the periodicity to a lesser extent, the thicknesses $D_i$ and the layer thickness ratios $\Gamma_i$ are chosen such that for all stacks $S_i$ of the section $|(D_i-D_{i+1})/D_i|\leq 0.1$ holds true and $\Gamma_i$ with increasing distance from the substrate decreases rather than increases. By complying with the additional boundary conditions for this section that the stack thicknesses are substantially constant and the layer thickness ratios within the stacks tend to decrease with increasing distance from the substrate, it is possible to provide reflective optical elements which firstly reflect uniformly well even in the case of high local angle-of-incidence bandwidths and over somewhat wider wavelength ranges and secondly have a sufficient number of sufficiently pronounced peaks for characterizing the lateral profile of the layer thicknesses through X-ray diffractometry.

Further configurations of the invention can be gathered from the description and the dependent claims.

The invention is explained in greater detail below on the basis of exemplary embodiments illustrated in the accompanying figures.

DETAILED DESCRIPTION

Figure 1:
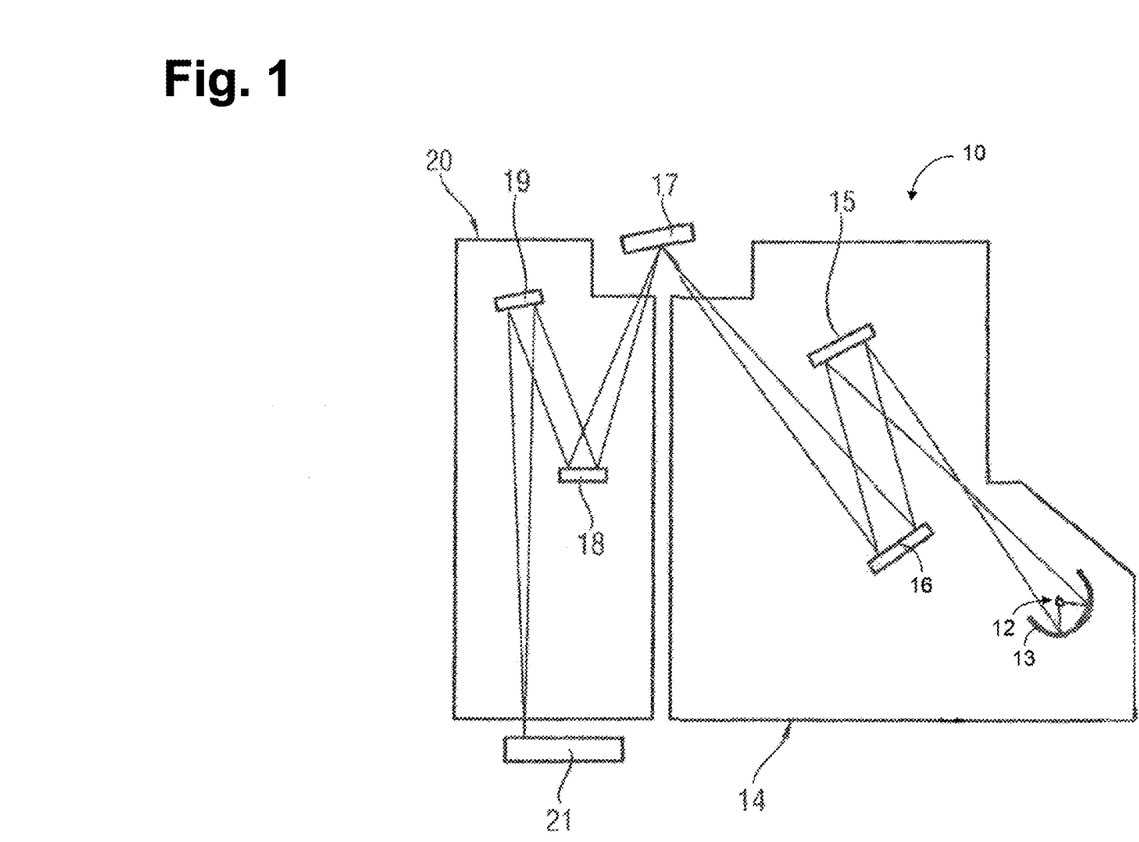
FIG. 1 a schematic illustration of a microlithographic projection exposure apparatus designed for operation in the EUV.

FIG. 1 schematically illustrates a microlithographic projection exposure apparatus 10 designed for operation in the EUV. Integral components are an illumination system 14, a mask 17 and a projection lens 20. The microlithographic projection exposure apparatus 10 is operated under vacuum conditions in order to minimize absorption losses of the EUV radiation. In the example illustrated, a plasma source is used as a radiation source 12. A synchrotron can also be used as a radiation source. The emitted radiation in the wavelength range of approximately 5 nm to 20 nm is firstly fixed by a collector mirror 13 and then introduced into the illumination system 14. In the example illustrated in FIG. 1, the illumination system 14 has two mirrors 15, 16. The mirrors 15, 16 guide the beam onto the mask 17 having the structure which is intended to be imaged onto the wafer 21. The mask 17 is likewise a reflective optical element for the EUV and soft X-ray wavelength range, which is exchanged depending on the production process. With the aid of the projection system 20, the beam reflected from the mask 17 is projected onto the wafer 21 and the structure of the mask is thereby imaged onto the wafer. In the example illustrated, the projection system 20 has two mirrors 18, 19. However, both the projection system 20 and the illumination system 14 can have respectively simply one, three, four, five or even more mirrors.

Figure 2:
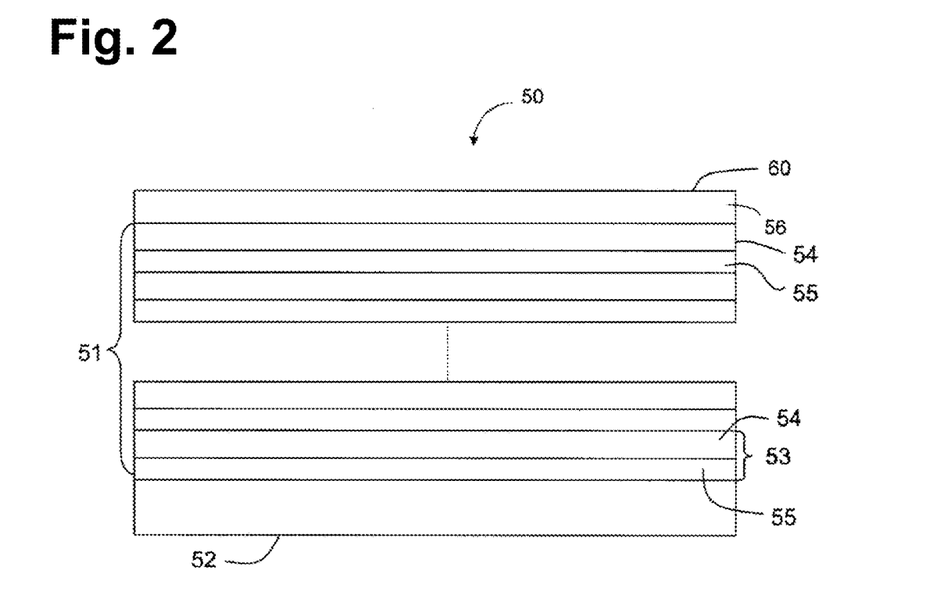
FIG. 2 a schematic illustration of a reflective optical element.

FIG. 2 schematically illustrates an exemplary, basic structure of a reflective optical element 50 based on a multilayer system 51. The multilayer system 51 has alternate layers of a material having a comparatively higher real part of the refractive index at the operating wavelength (also called "spacer") and of a material having a comparatively lower real part of the refractive index at the operating wavelength (also called "absorber"), wherein an absorber-spacer pair forms a partial stack 53. A crystal is thereby simulated whose lattice planes correspond to the absorber layers at which Bragg reflection takes place. The thicknesses of the individual layers 54, 55 and also of the repeating partial stacks 53 can be constant over the entire multilayer system 51 or else vary, depending on what spectral or angle-dependent reflection profile is intended to be achieved. The reflection profile can also be influenced in a targeted manner by the basic structure composed of absorber and spacer being supplemented by further more and less absorbent materials in order to increase the possible maximum reflectivity at the respective operating wavelength. For this purpose, in some partial stacks absorber and/or spacer material can be interchanged, or the partial stacks can be constructed from more than one absorber and/or spacer material or have additional layers composed of further materials. The absorber and spacer materials can have constant or else varying thicknesses over all the partial stacks in order to optimize the reflectivity. Furthermore, it is also possible to provide additional layers for example as diffusion barriers between spacer and absorber layers.

The multilayer system 51 is applied on a substrate 52 and forms a reflective surface 60. Materials having a low coefficient of thermal expansion are preferably chosen as substrate materials. A protective layer 56 can be provided on the multilayer system 51 in order to protect the reflective optical element 50 against contamination, inter alia.

The concept according to the invention is explained in greater detail below with reference to FIGS. 3A-7.

Figure 3A:
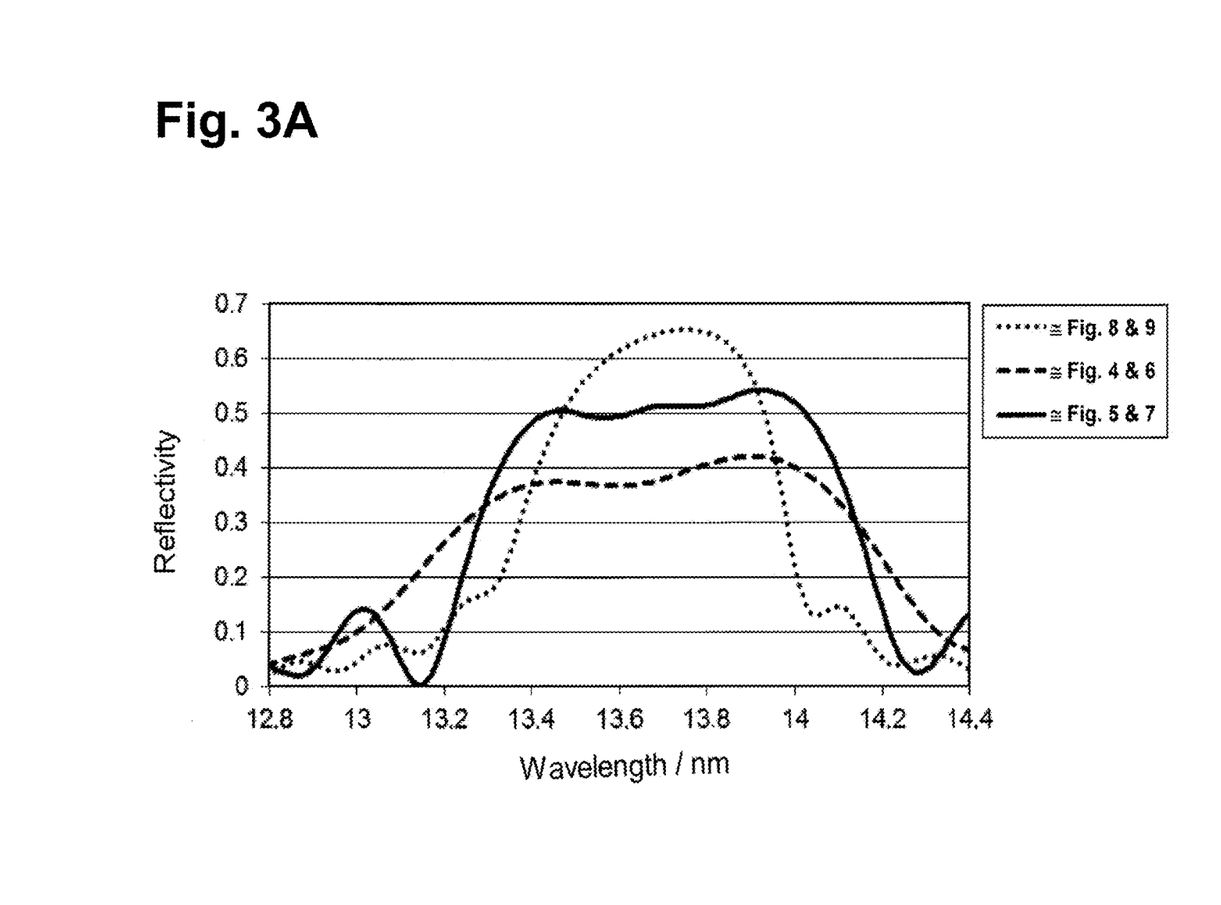
FIGS. 3A-3B diagrams for elucidating the reflectivity profile R vs. λ for reflective optical elements comprising different multilayer systems.

FIG. 3A illustrates the reflectivity for three reflective optical elements (explained in greater detail below) comprising different multilayer systems as a function of the wavelength for an angle of incidence of 10° with respect to the surface normal, wherein the multilayer systems are based respectively on molybdenum (Mo) as absorber material and silicon (Si) as spacer material. By way of example, ruthenium (Ru) and/or rhodium (Rh) can also be used as an alternative or in addition to molybdenum as absorber material.

Figure 10A:
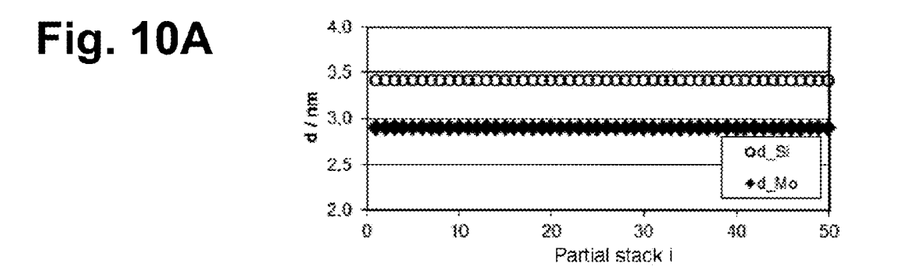
FIGS. 10A-10C diagrams of layer thickness profiles for the multilayer system from FIG. 9.
Figure 10B:
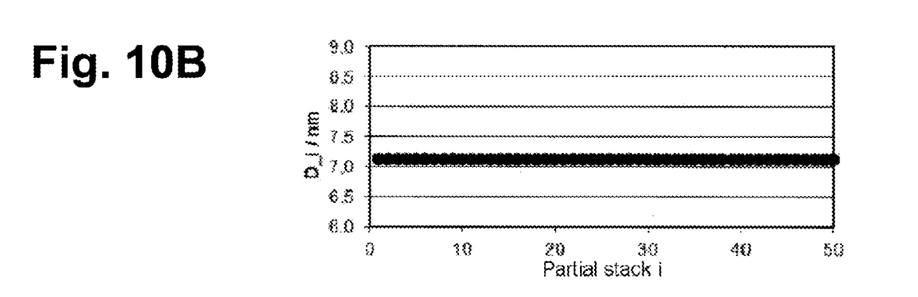
Figure 10C:
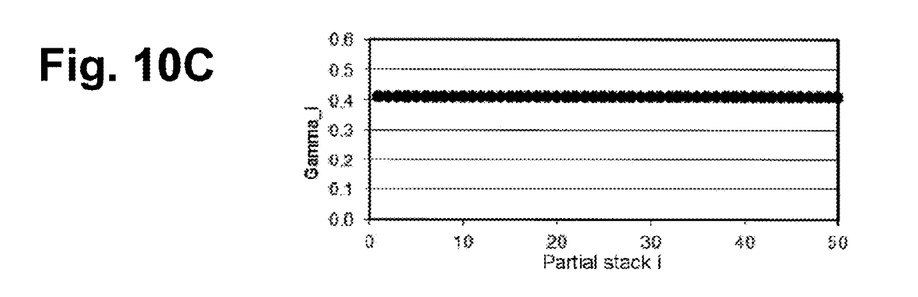

One of the reflective optical elements (dotted line in FIG. 3A) has a standard multilayer system having the construction illustrated in FIGS. 10A-10C. This involves a purely periodic multilayer system having 40 molybdenum-silicon partial stacks or periods. In this multilayer system, both the partial stack thickness D and the layer thickness ratio $\Gamma$ within a partial stack are constant over the entire multilayer system in the vertical layer construction. In FIGS. 10A-10C, the thickness d of the respective (molybdenum and silicon) individual layers (FIG. 10A) and the partial stack thickness D (FIG. 10B) and the layer thickness ratio $\Gamma$ (FIG. 10C) are plotted as a function of the number or index of the partial stack. The layer thickness ratio $\Gamma$ is defined here as the quotient of the thickness of the low refractive index layer (e.g. molybdenum) and the partial stack thickness (i.e. the layer thickness ratio $\Gamma$ has the value 0.5 given identical thicknesses of molybdenum layer and silicon layer). "Layer" is understood here to mean an individual layer (having uniform or homogeneous optical properties). Each low refractive index (e.g. molybdenum) layer together with a high refractive index (e.g. silicon) layer in each case forms a partial stack, wherein the total thickness of these two layers corresponds to the partial stack thickness.

Figure 9:
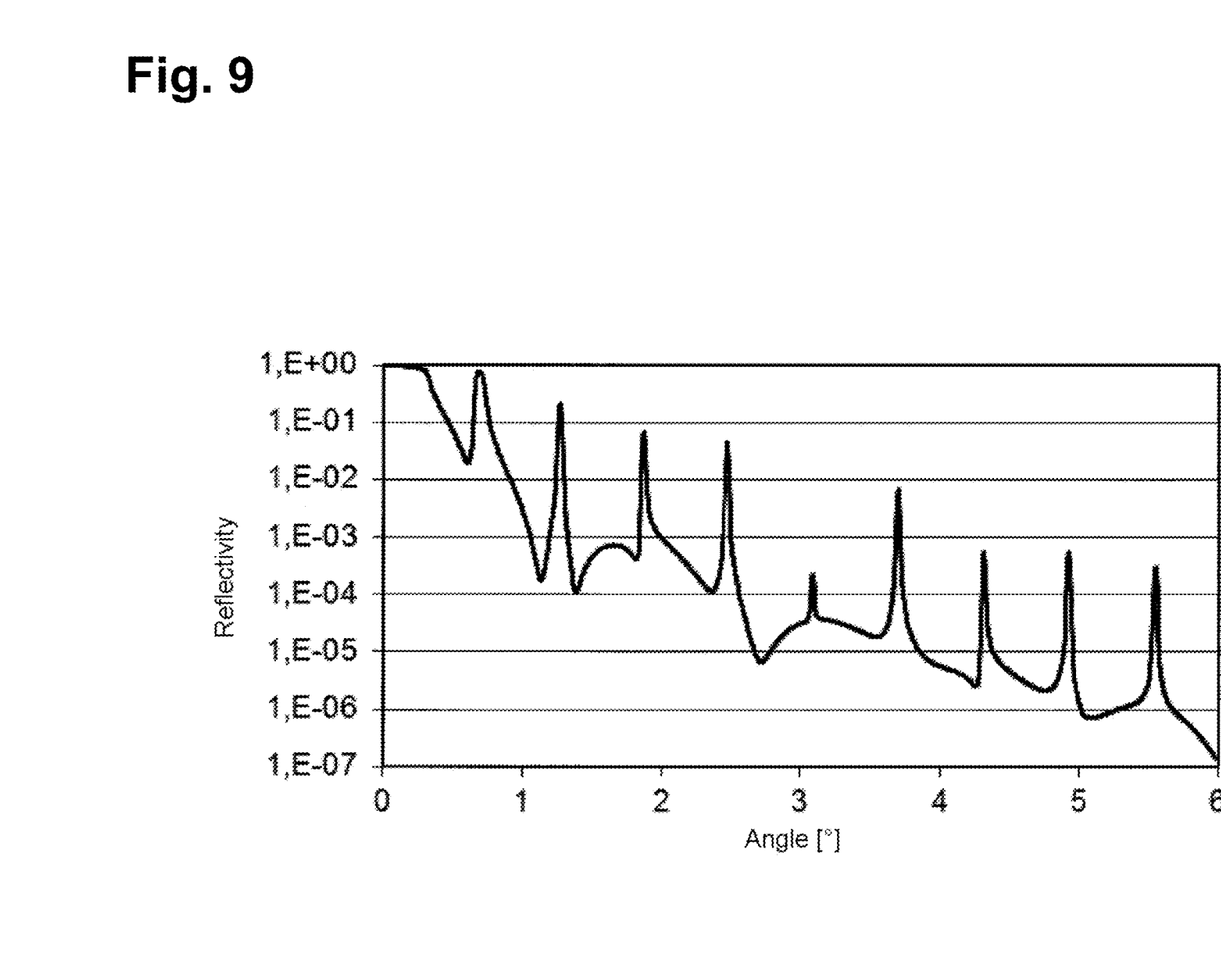
FIG. 9 a Cu—$K_\alpha$-diffractogram measured for a purely periodic multilayer system.

The element in accordance with FIGS. 10A-10C has a comparatively high maximum reflectivity of approximately 65% at a wavelength of 13.7 nm and an angle of incidence of 10° with respect to the surface normal, wherein the reflectivity curve in accordance with FIG. 3A is comparatively narrowband for this purely periodic layer construction. FIG. 9 shows the associated $Cu-K_\alpha$-diffractogram for the purely periodic layer construction having the layer thickness profile illustrated in FIGS. 10A-10C, in which the thickness d of the (molybdenum and silicon) individual layers (FIG. 10A) and the partial stack thickness D (FIG. 10B) and the layer thickness ratio $\Gamma$ (FIG. 10C) are constant over the entire layer construction. Accordingly, the corresponding peaks are comparatively narrow in the $Cu-K_\alpha$-diffractogram.

Figure 4A:
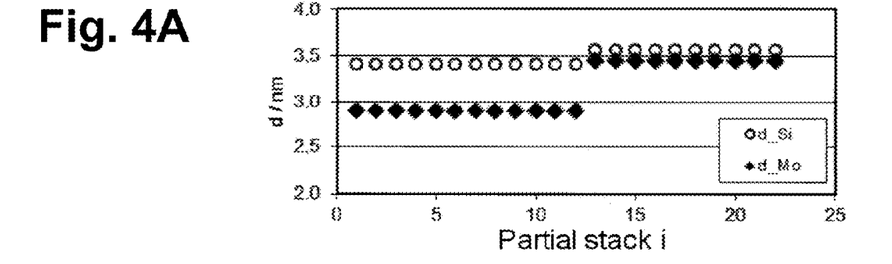
FIGS. 4A-4C diagrams of layer thickness profiles for a multilayer system having two different periodic sections.
Figure 4B:
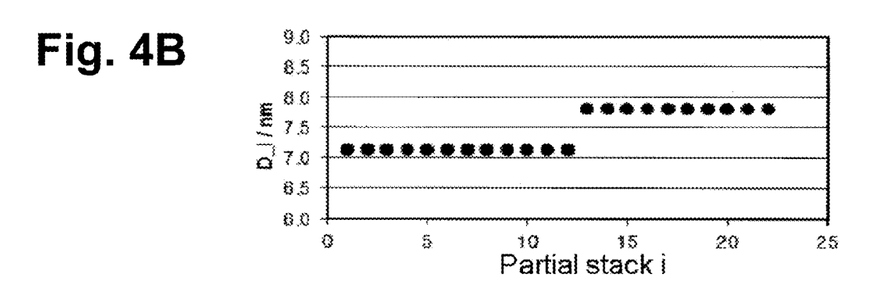
Figure 4C:
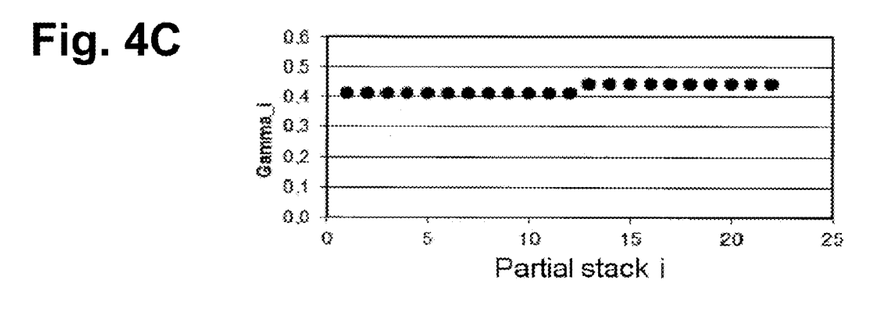

FIGS. 4A-4C show for comparison the construction of a multilayer system which is constructed as a conventional broadband multilayer system made from two sections having different periodicities. In the case of these sections, the partial stack thickness D has a constant, relatively small value in a first or "upper" section and a constant, relatively large value in a second or "lower" section (starting from the partial stack having the number 13). The first section, arranged further away from the substrate, comprises 12 partial stacks or periods of a partial stack thickness D of approximately 6.4 nm and with a layer thickness ratio $\Gamma$ of approximately 0.45. Arranged underneath on the substrate is the second section, which for its part comprises 10 partial stacks or periods with a partial stack thickness D of approximately 7.0 nm and a layer thickness ratio $\Gamma$ of approximately 0.5. This bipartite structure of the multilayer system leads, in accordance with FIG. 3A, to a reflectivity curve (dashed curve) having a lower maximum reflectivity of less than 55% in comparison with the standard multilayer system, wherein the full width half maximum (FWHM) of the curve is approximately 0.9 nm (in comparison with the value 0.6 nm in the case of the standard multilayer system from FIGS. 9-10C).

Figure 6:
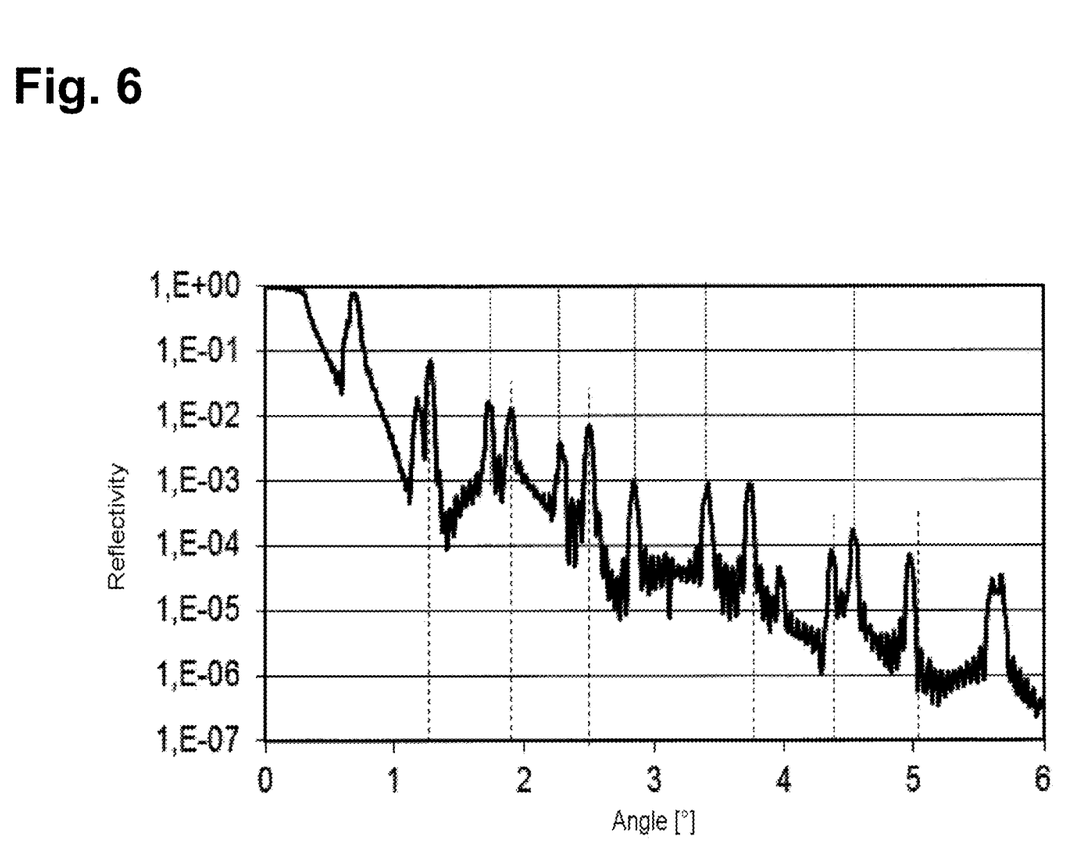
FIG. 6 a diffractogram measured for the multilayer system from FIG. 4.

FIG. 6 illustrates the $Cu-K_\alpha$-diffractogram of this reflective optical element. The abovementioned construction has the effect that over an angle-of-incidence range of 0° to 6° also in the case of the reflective optical element comprising a bipartite periodic multilayer system a multiplicity of sharp peaks still exist which can be used for control and optimization of the lateral layer thickness profile of the multilayer system during production.

In order to obtain a reflectivity curve having even less dependence on the wavelength or on the angle of incidence, the invention proposes a multilayer system which, although it is inherently aperiodic or stochastic, has at least one section that deviates comparatively little from the periodicity.

Figure 5A:
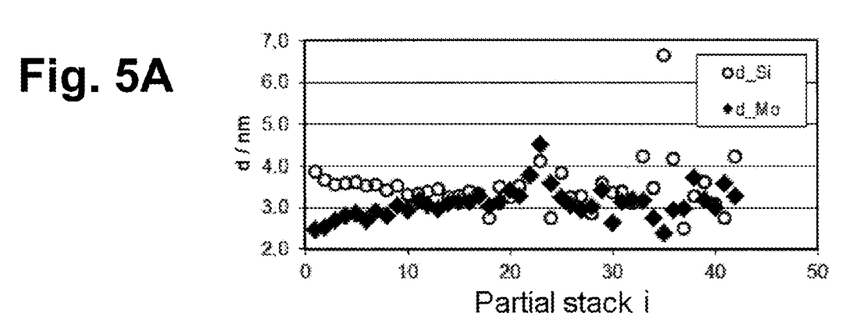
FIGS. 5A-5C diagrams of layer thickness profiles for a multilayer system having two sections of differently pronounced aperiodicity.
Figure 5B:
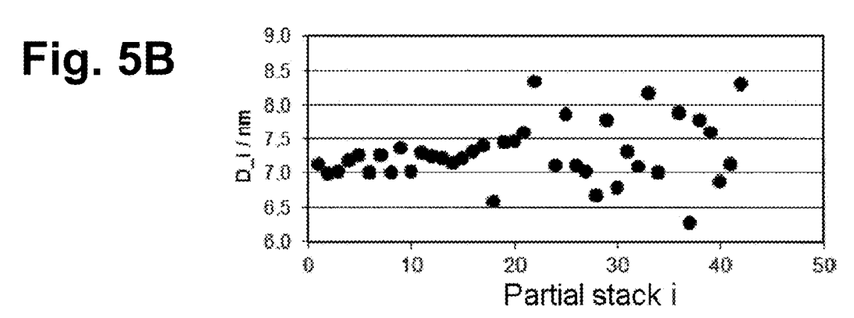
Figure 5C:
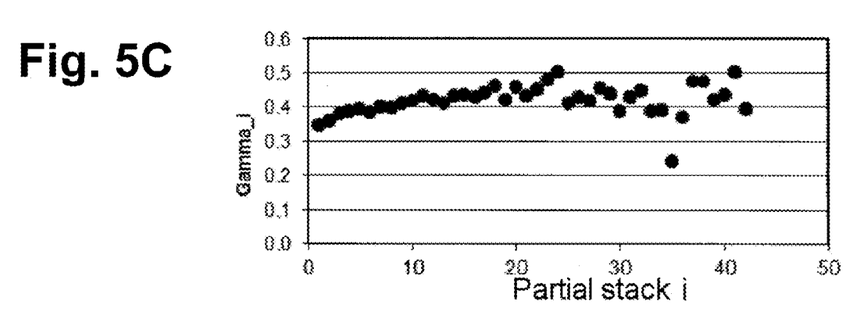

In FIGS. 5A-5C, for a reflective optical element according to the invention, the thickness d of the respective (molybdenum and silicon) individual layers (FIG. 5A) and the partial stack thickness D (FIG. 5B) and the layer thickness ratio Γ (FIG. 5C) are plotted as a function of the number or index of the partial stack. A multilayer system composed of two different sections is involved in the example from FIGS. 5A-5C. Firstly a totally stochastic section of the multilayer system is applied on a substrate, which comprises twenty-five partial stacks (having the index "18" to "42"). Arranged thereabove is a comparatively "periodic" section which comprises seventeen stacks and in which the partial stack thicknesses $D_i$ of adjacent partial stacks fluctuate by less than 10%, while the layer thickness ratio Γ or the proportion of molybdenum in the respective partial stack tends to increase toward the substrate.

As is evident from the reflectivity curve in FIG. 3A, the structure of the multilayer system in accordance with FIGS. 5A-5C leads to a particularly broadband reflectivity profile in which the full width half maximum is at approximately 1.1 nm of the wavelength. At the same time, the multilayer system of this reflective optical element in accordance with FIGS. 5A-5C has the advantage that, in accordance with FIG. 7, the associated Cu—$K_\alpha$-diffractogram (e.g. at a wavelength of 0.154 nm) likewise still has a plurality of sufficiently sharp peaks. Over an angle-of-incidence range of 0° to 6°, a multiplicity of even more greatly pronounced peaks are found, of which, in the example illustrated here, four peaks identified by four respective vertical lines were selected for the purpose of controlling or optimizing the lateral layer thickness profile.

Figure 7:
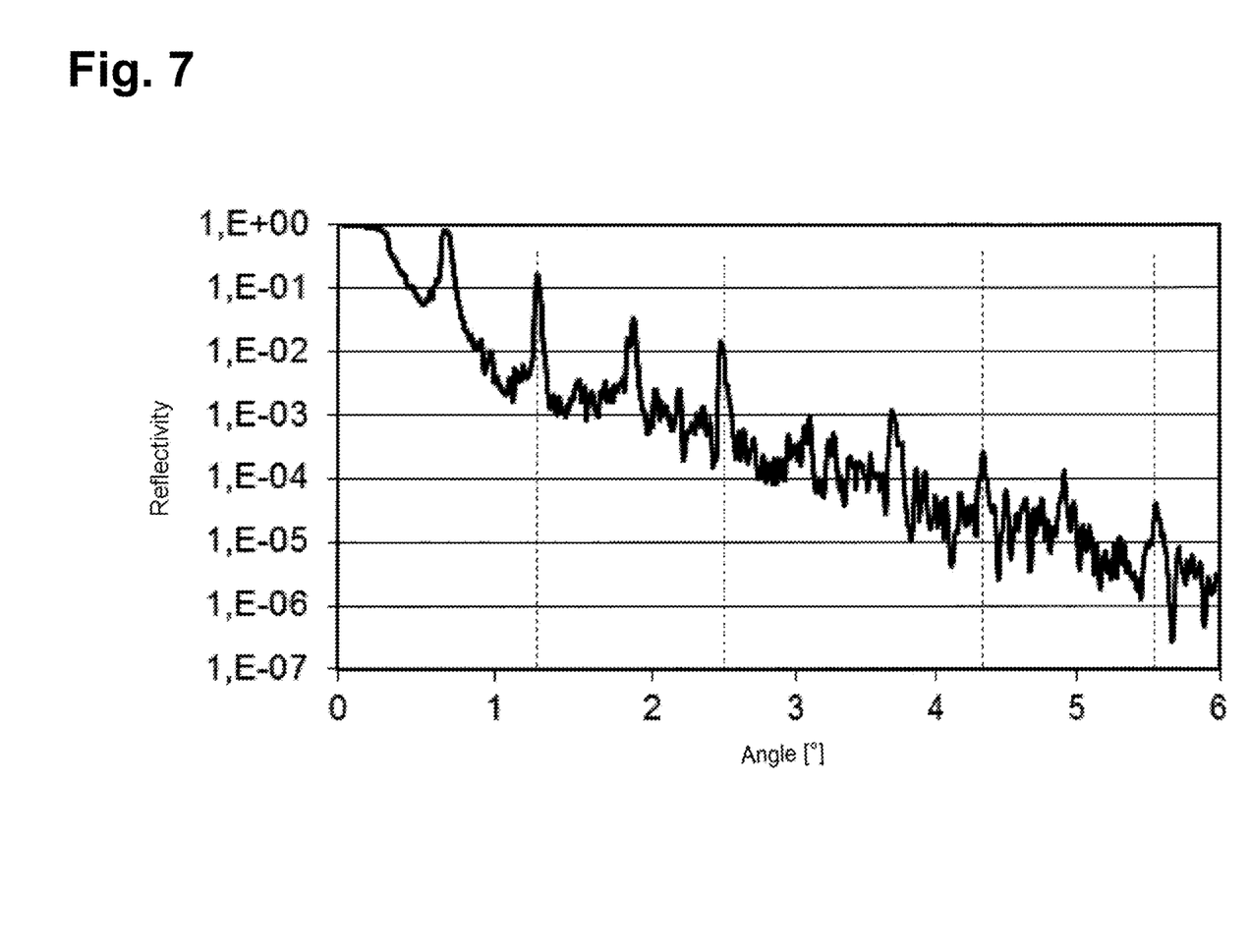
FIG. 7 a Cu—$K_\alpha$-diffractogram measured for the multilayer system from FIG. 5.

The circumstance that in the exemplary embodiment in FIGS. 5A-5C in a first section of the multilayer system (in the "upper" region of the layer sequence) the partial stack thickness D is still approximately constant (for instance up to the partial stack or period having the number 18) has the effect that—on account of an approximately periodic portion still present—discrete peaks are still discernible in the associated Cu—$K_\alpha$-diffractogram in FIG. 7 (in contrast to a "perfectly aperiodic" layer construction, where such peaks would no longer be identifiable). From the two peaks in the Cu—$K_\alpha$-diffractogram from FIG. 6, in the reflective optical element according to the invention in accordance with FIG. 7 only the peak of the upper section of the multilayer system having a still approximately constant partial stack thickness still respectively remains since, for the associated reflective optical element having the layer thickness profiles in accordance with FIG. 5, the lower portion of the layer stack is constructed comparatively stochastically.

Figure 3B:
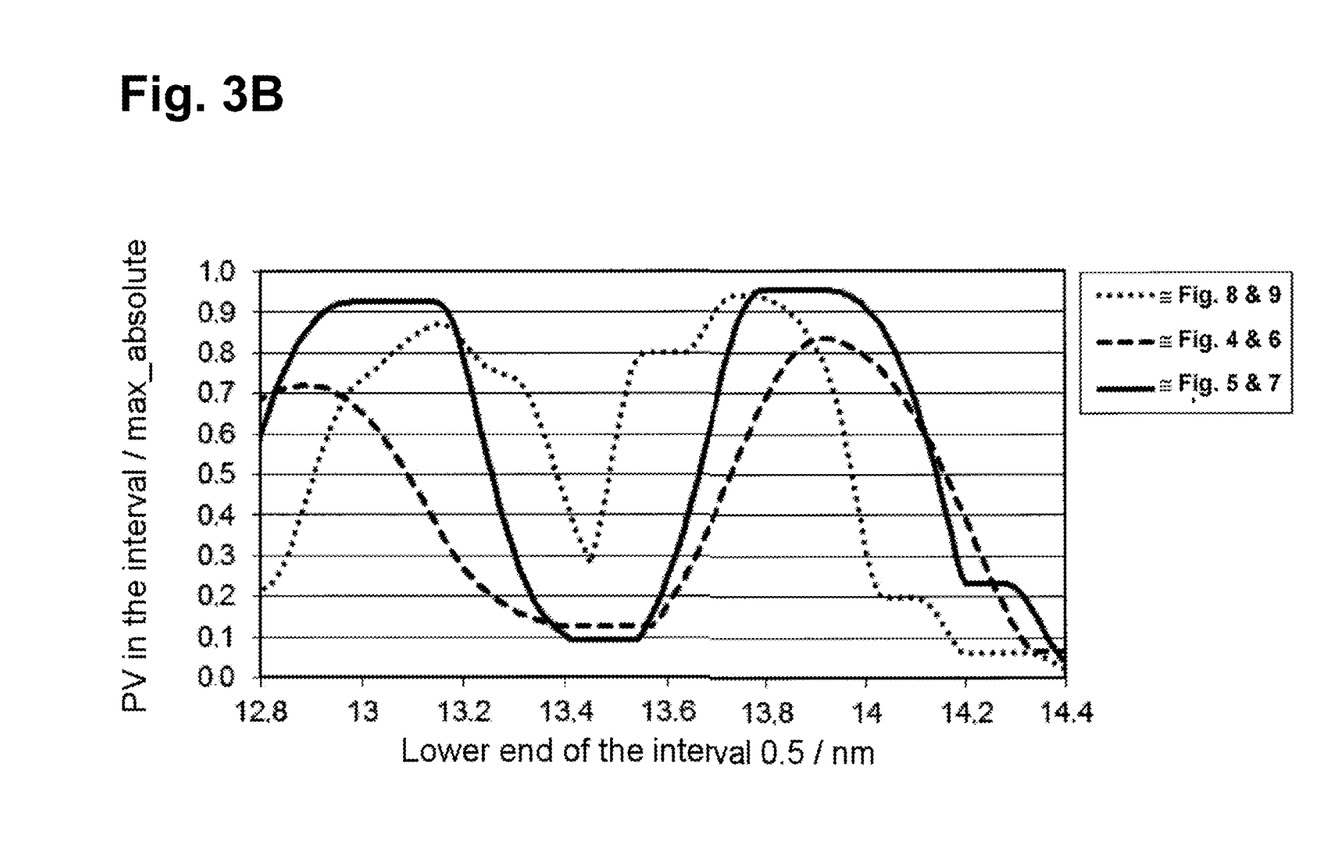

In FIG. 3B, proceeding from the values from FIG. 3A, the plotting is performed in such a way that the relative PV value for the different reflectivity curves can be read. The relative PV value is defined here as $PV=(R_{max\_rel}-R_{min\_rel})/R_{max\_abs}$, wherein $R_{max\_rel}$ denotes the maximum reflectivity value in this wavelength interval, $R_{min\_rel}$ denotes the minimum reflectivity value in this wavelength interval and $R_{max\_abs}$ denotes the absolute maximum reflectivity value. Preferably, the reflective optical element 50 has a reflectivity R, the wavelength dependence of which in a wavelength interval of Δλ=0.5 nm has a PV value of less than 0.25.

The construction of the multilayer system according to the invention makes it possible to provide reflective optical elements which firstly allow a high bandwidth of the reflectivity over the wavelength and/or over the angle of incidence and nevertheless exhibit a sufficient number of pronounced peaks in the diffractogram, with the consequence that it is possible to carry out control and, if appropriate, optimization of the lateral layer thickness profile through X-ray diffractometry.

A further aspect of the present invention is explained below with reference to FIG. 8. This aspect is based on the further insight that the reflection curve determined for a multilayer system according to the invention, as a function of the reflectivity on the wavelength or the angle of incidence, can then be used advantageously for an optimization of the individual parameters of the layer sequence if the reflection curve does not have a "perfect plateau", but rather a plurality of local extrema (maxima or minima) in the manner of a superimposed, weak oscillation.

Figure 8:
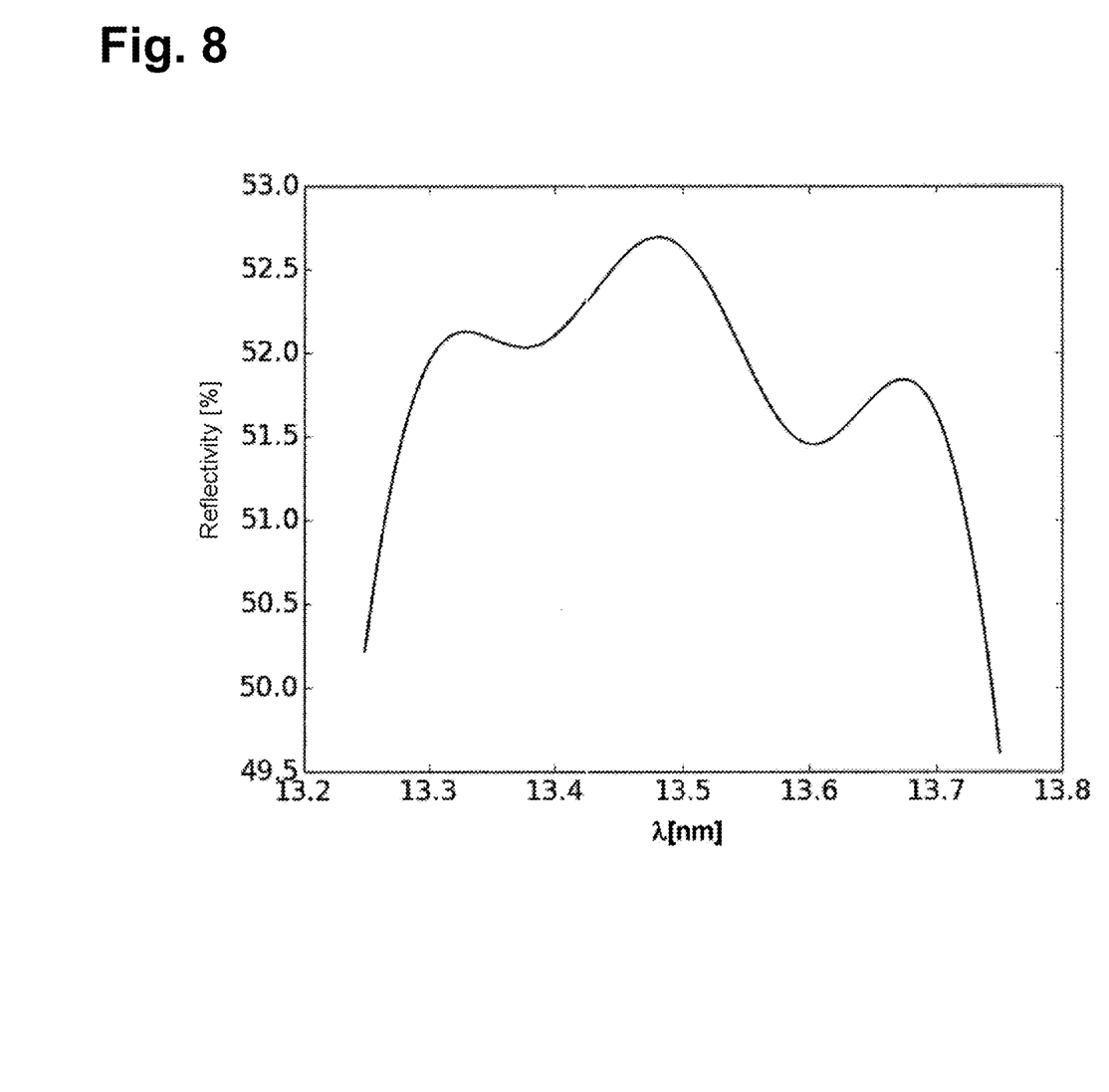
FIG. 8 a diagram with a reflectivity curve R vs. λ for elucidating a further aspect of the present invention.

The reflection curve shown merely by way of example in FIG. 8 in this respect (in which reflection curve, analogously to FIG. 3a, the reflectivity is plotted for unpolarized light or after averaging over all polarization states) has as an example three local maxima and two local minima having the reflectivity values plotted in table 1.

TABLE 1

| Wavelength λ [nm] | Reflectivity [%] |
|---|---|
| 13.330 | 52.125 |
| 13.377 | 52.029 |
| 13.480 | 52.689 |
| 13.602 | 51.451 |
| 13.674 | 51.837 |

It is then advantageous for an evaluation for the purpose of optimizing the individual parameters of the multilayer system if extrema (i.e. a minimum and a maximum) situated alongside one another in the reflectivity curve differ from one another in terms of the reflectivity by at least 0.1%, preferably by at least 0.5%, in each case relative to the larger value. In the example of FIG. 8 and table 1, e.g. the difference between the local extrema Nos. 3 and 4 is (52.689−51.451)/52.689=2.35%, as a result of which a characterization or optimization of the layer parameters is made possible.

Furthermore, advantageously, the relevant reflectivity values for the above-described local extrema (maxima and minima) also do not differ to an excessively great extent, as a result of which it is possible to exploit the circumstance that the optical system (e.g. the microlithographic projection exposure apparatus) is typically operated with a certain spectral distribution and thus different wavelengths and a certain averaging of the intensities obtained for different wavelengths thus also takes place. In other words, the local extrema (maxima and minima) in the reflection curve that are suitable for characterizing or optimizing the multilayer system are compensated for again on account of the averaging effect during operation of the optical system, such that no undesired impairment of the imaging result takes place as a result.

Even though the invention has been described on the basis of specific embodiments, numerous variations and alternative embodiments are evident to the person skilled in the art, e.g. through combination and/or exchange of features of individual embodiments. Accordingly, such variations and alternative embodiments are concomitantly encompassed by the present invention, and the scope of the invention is restricted only within the meaning of the appended patent claims and equivalents thereof.

What is claimed is:

1. A reflective optical element, comprising a substrate and a multilayer system arranged on the substrate,
   wherein the multilayer system has a plurality of partial stacks each comprising a first layer of a first material having a first thickness and at least one second layer of a second material having a second thickness, wherein the first material and the second material differ from one another in respective values of the real part of the refractive index at an operating wavelength of the reflective optical element, wherein each of the partial stacks has a respective partial stack thickness ($D_i$) and a respective layer thickness ratio ($\Gamma_i$), wherein the respective layer thickness ratio ($\Gamma_i$) is defined as a quotient of the thickness of the respective first layer and the respective partial stack thickness ($D_i$);
   wherein in a first section of the multilayer system, for at least one of: the respective partial stack thickness ($D_i$) and the respective layer thickness ratio ($\Gamma_i$), a mean square deviation from respective mean values therefor is nonzero and at least 10% less than in a second section of the multilayer system;
   wherein for the first section of the multilayer system, the thicknesses a are such that for the first section $|(D_i - D_{i+1})/D_i| \leq 0.1$;
   wherein for the second section of the multilayer system, the respective partial stack thickness ($D_i$) and the respective layer thickness ratio ($\Gamma_i$) are such that the reflective optical element has a reflectivity R, a wavelength dependence of which in a wavelength interval of $\Delta\lambda = 0.5$ nm has a PV value of less than 0.25, wherein the PV value is defined as $PV = (R_{max\_rel} - R_{min\_rel})/R_{max\_abs}$, wherein $R_{max\_rel}$ denotes a maximum reflectivity value in the wavelength interval $\Delta\lambda$, $R_{min\_rel}$ denotes a minimum reflectivity value in the wavelength interval $\Delta\lambda$, and $R_{max\_abs}$ denotes an absolute maximum reflectivity value; and
   wherein the respective partial stack thickness ($D_i$) and the respective layer thickness ratio ($\Gamma_i$) in the multilayer system are such that a wavelength dependence of the reflectivity R of the reflective optical element in a wavelength interval of $\Delta\lambda = 0.5$ nm has at least two local reflectivity extrema which differ from one another in reflectivity by at least 0.1%, relative to a larger value of the two local reflectivity extrema.

2. The reflective optical element as claimed in claim 1, wherein, in the first section of the multilayer system, for at least one of: the respective partial stack thickness ($D_i$) and the respective layer thickness ratio ($\Gamma_i$), the mean square deviation from the respective mean values therefor is at least 20% less than in the second section of the multilayer system.

3. The reflective optical element as claimed in claim 2, wherein, in the first section of the multilayer system, for at least one of: the respective partial stack thickness ($D_i$) and the respective layer thickness ratio ($\Gamma_i$), the mean square deviation from the respective mean values therefor is at least 50% less than in the second section of the multilayer system.

4. The reflective optical element as claimed in claim 1, wherein the wavelength dependence of the reflectivity R in a wavelength interval of $\Delta\lambda = 0.5$ nm has a PV value of less than 0.20.

5. The reflective optical element as claimed in claim 4, wherein the wavelength dependence of the reflectivity R in a wavelength interval of $\Delta\lambda = 0.5$ nm has a PV value of less than 0.15.

6. The reflective optical element as claimed in claim 1, wherein the second section is arranged closer to the substrate than is the first section.

7. The reflective optical element as claimed in claim 1, wherein the first section and the second section jointly form an entire multilayer system.

8. The reflective optical element as claimed in claim 1, wherein the local reflectivity extrema differ from one another in reflectivity by at most 5%, relative to the larger value.

9. The reflective optical element as claimed in claim 1, wherein the first material is selected from the group consisting of molybdenum (Mo), ruthenium (Ru) and rhodium (Rh).

10. The reflective optical element as claimed in claim 1, wherein the second material is silicon (Si).

11. The reflective optical element as claimed in claim 1, and configured for an operating wavelength of less than 30 nm.

12. The reflective optical element as claimed in claim 11, configured for an operating wavelength of less than 15 nm.

13. An optical system of a microlithographic projection exposure apparatus, comprising a reflective optical element as claimed in claim 1.

14. A microlithographic projection exposure apparatus, comprising an optical system as claimed in claim 13.

15. A reflective optical element, comprising a substrate and a multilayer system arranged on the substrate,
   wherein the multilayer system has a plurality of partial stacks each comprising a first layer of a first material and at least one second layer of a second material, wherein the first material and the second material differ from one another in respective values of the real part of the refractive index at an operating wavelength of the reflective optical element;
   wherein the reflective optical element has a reflectivity R, the wavelength dependence of which in a wavelength interval of $\Delta\lambda = 0.5$ nm has a PV value of less than 0.25, wherein the PV value is defined as $PV = (R_{max\_rel} - R_{min\_rel})/R_{max\_abs}$, wherein $R_{max\_rel}$ denotes a maximum reflectivity value in the wavelength interval $\Delta\lambda$, $R_{min\_rel}$ denotes a minimum reflectivity value in the wavelength interval $\Delta\lambda$, and $R_{max\_abs}$ denotes an absolute maximum reflectivity; and
   wherein a wavelength dependence of the reflectivity R of the reflective optical element in a wavelength interval of $\Delta\lambda = 0.5$ nm has at least two local extrema which differ from one another in reflectivity by at least 0.1% and by at most 5%, respectively relative to a larger value of the two local extrema.

16. The reflective optical element as claimed in claim 15, wherein two local extrema differ from one another in reflectivity by at least 0.5%, relative to the larger value.

17. The reflective optical element as claimed in claim 15, wherein the local extrema differ from one another in reflectivity by at most 2.5%, relative to the larger value.

18. The reflective optical element as claimed in claim 17, wherein the local extrema differ from one another in reflectivity by at most 1%, relative to the larger value.

19. The reflective optical element as claimed in claim 15, wherein the first material is selected from the group consisting of molybdenum (Mo), ruthenium (Ru) and rhodium (Rh).

20. The reflective optical element as claimed in claim 15, wherein the second material is silicon (Si).

21. The reflective optical element as claimed in claim 15, and configured for an operating wavelength of less than 30 nm.

22. The reflective optical element as claimed in claim 21, configured for an operating wavelength of less than 15 nm.

23. An optical system of a microlithographic projection exposure apparatus, comprising a reflective optical element as claimed in claim 15.

24. A microlithographic projection exposure apparatus, comprising an optical system as claimed in claim 23.

* * * * *